United States Patent
Miyashita et al.

[11] Patent Number: 6,140,746
[45] Date of Patent: *Oct. 31, 2000

[54] PIEZOELECTRIC THIN FILM, METHOD FOR PRODUCING THE SAME, AND INK JET RECORDING HEAD USING THE THIN FILM

[75] Inventors: Satoru Miyashita; Masakazu Shinozuka; Kouji Sumi; Masami Murai; Tetsushi Takahashi, all of Suwa, Japan

[73] Assignee: Seiko Epson Corporation, Shinjuku-Ku, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/626,973

[22] Filed: Apr. 3, 1996

[30] Foreign Application Priority Data

| | | | |
|---|---|---|---|
| Apr. 3, 1995 | [JP] | Japan | 7-077633 |
| Aug. 23, 1995 | [JP] | Japan | 7-215090 |
| Dec. 12, 1995 | [JP] | Japan | 7-322658 |
| Dec. 12, 1995 | [JP] | Japan | 7-322659 |
| Dec. 12, 1995 | [JP] | Japan | 7-322660 |
| Dec. 12, 1995 | [JP] | Japan | 7-322661 |

[51] Int. Cl.$^7$ ................................................ H01L 41/08
[52] U.S. Cl. ........................................................ 310/358
[58] Field of Search .................................... 310/358, 800; 252/62.9

[56] References Cited

U.S. PATENT DOCUMENTS

| | | | |
|---|---|---|---|
| 3,424,686 | 1/1969 | Ouchi et al. | 252/62.9 |
| 3,425,944 | 2/1969 | Ouchi et al. | 252/62.9 |
| 3,484,377 | 12/1969 | Tsubouchi et al. | 252/62.9 |
| 3,956,150 | 5/1976 | Ouchi et al. | 252/62.9 |
| 4,355,256 | 10/1982 | Perduiju et al. | 310/358 |
| 4,383,196 | 5/1983 | Perduijn et al. | 310/358 |
| 4,830,996 | 5/1989 | Hirai et al. | 501/136 |
| 5,198,269 | 3/1993 | Swartz | 427/226 |
| 5,265,315 | 11/1993 | Hoisington | 29/25.35 |
| 5,622,901 | 4/1997 | Fukada | 438/50 |
| 5,634,999 | 6/1997 | Takeuchi et al. | 156/89 |

FOREIGN PATENT DOCUMENTS

| | | | |
|---|---|---|---|
| 0344978 | 12/1989 | European Pat. Off. | C09B 35/49 |
| 9012755 | 11/1990 | WIPO | C01G 25/00 |
| 9013149 | 11/1990 | WIPO | H01L 41/24 |

OTHER PUBLICATIONS

Guanghua, Y. et al. "Preparation of PB(Zr, Ti)O$_3$ "Journal of Applied Physics, Sep. 1, 1988, USA, vol. 64 Nos. ISSN 0021&8979.

Amanuma, K., et al. "Ferroelectric Properties of Sol–Gel Derived Pb(Zr, Ti)O$_3$ Thin Films." *Jpn. J. Appl. Phys.*, vol. 32, No. 9B (Sep. 1993) pp. 4150–4153.

Reaney, I. M., et al. "Use of Transmission Electron Microscopy for the Characterization of Rapid Thermally Annealed, Solution–Gel, Lead Zirconate Titanate Films." *Journal of the American Ceramic Society*, vol. 77, No. 5 pp. 1209–1216, Dec. 1994.

Brooks, K. G., et al. "Orientation of rapid thermally annealed lead zirconate titanate thin films on (111) Pt substrates" *J. Mater. Res.*, vol. 9, No. 10 (Oct. 1994) p. 2540–2553.

*Primary Examiner*—Thomas M. Dougherty
*Attorney, Agent, or Firm*—Ladas & Parry

[57] ABSTRACT

A piezoelectric thin film which has good properties, for example, a high dielectric constant and a high piezoelectric strain constant is disclosed. A method for producing a piezoelectric film, which causes no crack during annealing, is also disclosed. The piezoelectric thin film has a thickness in the range of from 0.5 to 20 μm, comprises crystal grains having an average grain diameter of 0.005 to 0.2 μm, and is free from any multilayer structure in its cross section. The process for producing a piezoelectric thin film comprises that steps of: coating a substrate with a sol composition comprising a sol, of a metal component for constituting a piezoelectric film, and a polymer compound and then drying the coating to form a film; pre-sintering the film to form a porous thin film of gel comprising an amorphous metal oxide; pre-annealing the porous thin film of gel to bring the film to a film formed of a crystalline metal oxide; repeating the above steps at least once to form a laminated film formed of a crystalline metal oxide; and annealing the laminated film to grow crystal grains of perovskite type in the film into a larger size.

31 Claims, 4 Drawing Sheets

PIEZOELECTRIC THIN FILM, METHOD FOR PRODUCING THE SAME, AND INK JET RECORDING HEAD USING THE THIN FILM

BACKGROUND OF THE INVENTION

1. Field of the Invention

The present invention relates to a piezoelectric thin film usable as an actuator in ink jet recording apparatuses and the like.

2. Background Art

Piezoelectric and ferroelectric thin films represented by lead zirconate titanate ("PZT") thin films can be prepared by sputtering, sol-gel processing, CVD, laser ablation or other processes.

In particular, according to the sol-gel process, the composition of the PZT film can be easily controlled. Further, the sol-gel process has an additional advantage that a thin film can be successfully formed by repeating the step of coating a sol composition and the step of presintering the coating. In addition, patterning by photoetching can be carried out during the preparation of a piezoelectric device by the sol-gel process so that the PZT film is easily formed into a piezoelectric device. An ink jet recording head using a piezoelectric thin film prepared by the sol-gel process has also been proposed (Japanese Patent Laid-Open No. 504740/1993). A film thickness of about 0.5 to 20 $\mu$m is in general necessary for a piezoelectric device for an ink jet recording head. Further, in the piezoelectric device for the ink jet recording head, the piezoelectric strain constant is high. The growth of crystal grains by annealing at a temperature of 700° C. or above may be necessary to preferably provide such a high piezoelectric strain constant.

However, an attempt to prepare a piezoelectric thin film having a certain film thickness, for example, a film thickness of not less than 1 $\mu$m, by the sol-gel process has often cracks in the film during annealing step for the formation of a perovskite structure.

Further, a method in which comprises the steps of coating a sol composition, heating the coating at a high temperature to cause crystallization, and repeating the steps to increase the film thickness has been proposed (e.g., Philips J. Res. 47 (1993) 263–285). So far as the present inventors know, however, the piezoelectric thin film prepared by this method has an interface created by the lamination, i.e., a multilayer structure. The presence of the interface adversely affects piezoelectric properties and often makes it impossible to realize good patterning by etching in the preparation of a piezoelectric device with the thin film.

Therefore, a need still exists for a piezoelectric thin film having good properties and a method for producing the same has been desired in the art.

SUMMARY OF THE INVENTION

Accordingly, an object of the present invention is to provide a piezoelectric thin film having good properties, for example, a high dielectric constant and a high piezoelectric strain constant, and a method for producing the same.

Another object of the present invention is to provide a piezoelectric thin film, which does not suffer from cracks at the time of annealing and has no interface created by the lamination, and a method for producing the same.

The present inventors have now found a piezoelectric thin film having good properties, and, further, a piezoelectric composition, which is very advantageous for a piezoelectric material in a thin film form, and a production process suitable for the production of such a piezoelectric thin film.

The piezoelectric thin film according to the present invention has a thickness in the range of from 0.5 to 20 $\mu$m, comprises crystal grains having an average grain diameter of 0.005 to 0.2 $\mu$m and is free from any multilayer structure in its cross section.

Figure 1:
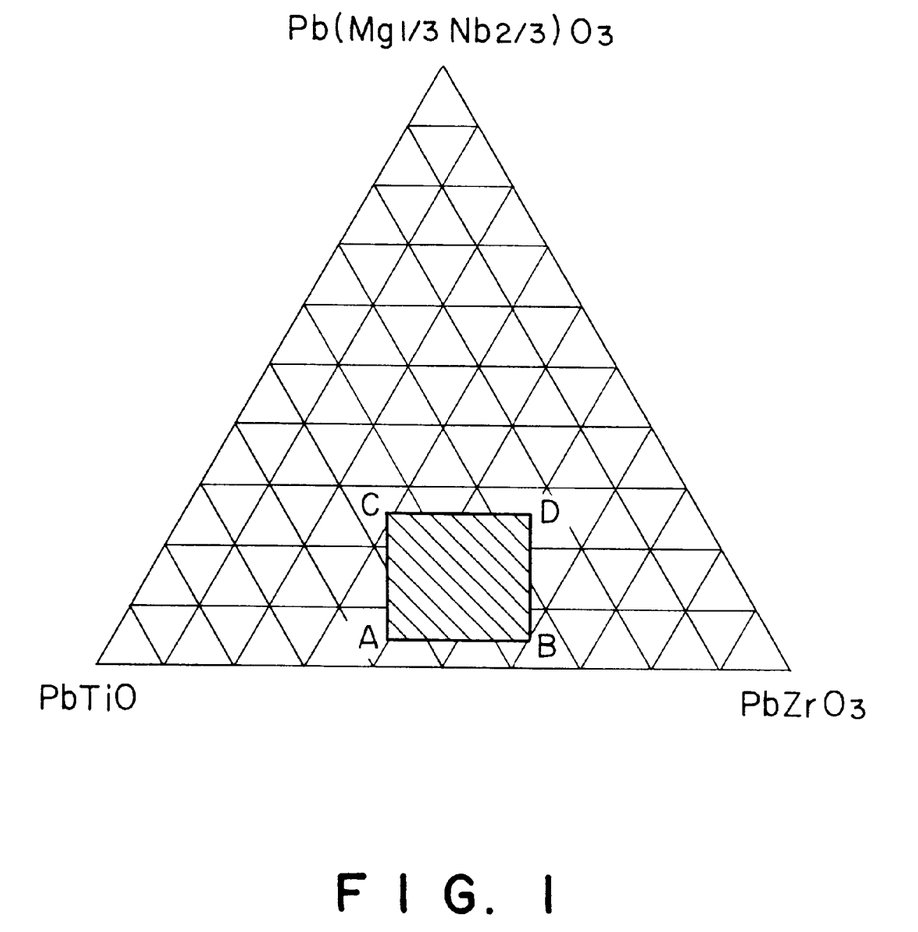
FIG. 1 is a three-component composition diagram showing a preferred composition of the piezoelectric thin film according to the present invention.

According to the present invention, there provides a piezoelectric thin film having a specific composition. The piezoelectirc thin film of an aspect of the present invention comprises a piezoelectric material of a three-component system represented by the formula xPb $(Mg_{1/3}Nb_{2/3})O_3$-$yPbZrO_3$-$zPbTiO_3$, wherein x, y, and z represent molar ratios provided that x+y+z=1, and x, y, and z indicate a point falling within the area defined by lines. connecting the following four points A, B, C, and D in a composition diagram of the three-component system as shown in FIG. 1:

A ($x$=0.05, $y$=0.40, $z$=0.55),

B ($x$=0.05, $y$=0.60, $z$=0.35),

C ($x$=0.25, $y$=0.30, $z$=0.45), and

D ($x$=0.25, $y$=0.50, $z$=0.25).

According to the present invention, there provides a piezoelectric thin film having another specific composition. The piezoelectirc thin film of another aspect of the present invention comprises a piezoelectric material of a three-component system represented by the formula $Pb(1-\alpha)\Gamma\alpha$ $[(Mg_{1/3}Nb_{2/3})xZryTiz]O_3$, wherein x, y, and z represent molar ratios provided that x+y+z=1, and x, y, and z indicate a point falling within the area defined by lines connecting the following four points A, B, C, and D in a composition diagram of the three-component system represented by said formula:

A ($x$=0.05, $y$=0.40, $z$=0.55),

B ($x$=0.05, $y$=0.60, $z$=0.35),

C ($x$=0.25, $y$=0.30, $z$=0.45), and

D ($x$=0.25, $y$=0.50, $z$=0.25);

$\Gamma$ represents an element selected from Sr, Ca, Ba, Bi, and La; and $\alpha$ is $0<\alpha\leq0.2$.

The method for producing a piezoelectric thin film according to a first aspect of the present invention is based on a sol-gel process and comprises the steps of:

a) coating a substrate with a sol composition comprising a sol, of a metal component for constituting a piezoelectric film, and a polymer compound and then drying the coating to form a film;

b) pre-sintering the film to form a porous thin film of gel comprising an amorphous metal oxide;

c) pre-annealing the porous thin film of gel to bring the film to a film formed of a crystalline metal oxide;

d) repeating the steps a), b), and c) at least once to form a laminated film formed of a crystalline metal oxide; and e) annealing the film prepared in the step d) to grow crystal grains of perovskite type in the film into a larger size.

The method for producing a piezoelectric thin film according to a second aspect of the present invention is based on a sol-gel process and comprises the steps of:

a) coating a substrate with a sol composition comprising a sol, of a metal component for constituting a piezoelectric film, and a polymer compound and then drying the coating to form a film;

b) pre-sintering the film to form a porous thin film of gel comprising an amorphous metal oxide;

f) repeating the steps a) and b) at least once to form a laminate of porous thin films comprising an amorphous metal oxide;

c') pre-annealing the laminate of thin film to convert the laminate to a film formed of a crystalline metal oxide;

d') repeating the steps f) and c') at least once to form a laminated film formed of a crystalline metal oxide; and e') annealing the film prepared in the step d') to grow crystal grains of perovskite type in the film into a larger size.

DETAILED DESCRIPTION OF THE INVENTION

Piezoelectric Thin Film

The piezoelectric thin film according to the present invention has a thickness in the range of from 0.5 to 20 $\mu$m. The piezoelectric thin film, according to the present invention, having such a very small thickness has favorable properties. In order to provide the favorable properties, preferably, the thin film comprises crystal grains having an average grain diameter of 0.005 to 0.2 $\mu$m and is free from any multilayer structure in its cross section. According to a preferred embodiment of the present invention, the thickness of the thin film is 0.7 $\mu$m to 10 $\mu$m, and the average diameter of the crystal grains is 0.01 $\mu$m to 0.1 $\mu$m. Further, in the present invention, the crystal structure is preferably composed mainly of a perovskite structure. Such a piezoelectric thin film has good properties. Specifically, it has a specific dielectric constant of preferably about 1,000 to 3,500, more preferably about 1,200 to 2,800, and a piezoelectric strain constant of preferably about 70 pC/N or more, more preferably about 100 pC/N or more.

The above described piezoelectric thin film may be combined with the specific compositions of the present invention. The piezoelectric thin film combined with the specific composition of the present invention has an excellent character.

According to a preferred embodiment of the present invention, there provides a piezoelectric thin film comprising a piezoelectric material of a three-component system represented by the above formula xPb (Mg$_{1/3}$Nb$_{2/3}$)O$_3$-yPbZrO$_3$-zPbTiO$_3$, wherein x, y, and z represent molar ratios provided that x+y+z=1, and x, y, and z indicate a position falling within the area defined by lines connecting the following four points A, B, C, and D in a composition diagram of the three-component system as shown in FIG. 1.

Further, according to another preferred embodiment of the present invention, there is provided a piezoelectric thin film which may have such a composition that, in the above formula, up to about 20% by mole, preferably 5 to 15% by mole of Pb has been replaced with an element selected from Sr, Ca, Ba, Bi, and La. In particular, the piezoelectric thin film comprises a piezoelectric material of a three-component system represented by the formula Pb(1−α)Γα[(Mg$_{1/3}$Nb$_{2/3}$)xZryTiz]O$_3$, wherein x, y, and z represent molar ratios provided that x+y+z=1, and x, y, and z indicate a point falling within the area defined by lines connecting the following four points A, B, C, and D in a composition diagram of the three-component system represented by said formula:

A ($x$=0.05, $y$=0.40, $z$=0.55),

B ($x$=0.05, $y$=0.60, $z$=0.35),

C ($x$=0.25, $y$=0.30, $z$=0.45), and

D ($x$=0.25, $y$=0.50, $z$=0.25);

Γ represents an element selected from Sr, Ca, Ba, Bi, and La; and a represents any number satisfying the relationship 0<α≦0.2. The composition can provide a piezoelectric thin film having further improved properties.

Furthermore, according to a further preferred embodiment of the present invention, the thin film may have such a modified composition that Mg in the formula has been replaced either partially or entirely by an element selected from Co, Zn, Mn, and Ni and/or Nb in the formula has been replaced partially by Ta or Sb and/or Zr or Ti has been replaced partially by an element selected from Sb, Fe, Al, and Cr. The above modification of the composition enables the piezoelectric strain constant, the specific permittivity, and the Young's modulus to be easily regulated to respective proper values. In particular, the regulation of the specific permittivity is preferred from the viewpoint of regulating the amount of heat generated in the piezoelectric thin film.

According to another aspect of the present invention, the thin film may further comprise Pb or Pb compound such as PbO so that the mole ratio of Pb to (Mg+Nb+Zr+Ti) is 1 to 1.2, preferably 1 to 1.15. The thin film having the excessive Pb content has an excellent in the piezoelectric strain constant.

When a voltage V depending upon the time (V=V(t) wherein t represents the time) is applied to a piezoelectric thin-film device having a capacity C, that is, a capacitor, the current i, which flows through the piezoelectric thin-film device, is i=C (dV/dt). Since the amount of heat, Q, generated in the piezoelectric thin-film device at that time is proportional to i×i, it is important to lower the capacity C, in other words, the specific permittivity of the piezoelectric thin film.

On the other hand, the distortion rate of the piezoelectric thin film upon the application of a voltage is proportional to the applied voltage. Even when a lowering in piezoelectric strain properties is compensated for by increasing the applied voltage V, the relationship i=C (dV/dt) shows that the harmful influence of the heat generation can be reduced by keeping the time gradient constant.

The regulation of the Young's modulus is advantageous for the following reason. Specifically, in an ink jet recording head which projects ink droplets by taking advantage of a pressure generated in an ink passage, the rigidity in a section which generates a pressure or in pressure transmission section, in other words, the elastic compliance (1/Y) of the constituent members, is an important characteristic factors for ink projection. The elastic compliance of the constituent members influences the speed and weight of projected ink droplets, the attenuation, of ink vibration within a passage, which has an influence on the response frequency, interference between adjacent ink passages and the like.

An ink jet recording head using the piezoelectric thin-film device according to the present invention can easily suppress the Young's modulus of the piezoelectric thin film provided on a vibrating sheet defining an ink passage, can enhance the compliance of the ink passage, and ensure ink projection properties, particularly can prevent the interference between the adjacent ink passages.

The composition of the piezoelectric thin film according to the present invention may be regulated by regulating the ratio of metals in a sol composition used in the production method which will be described later.

Method for Producing Piezoelectric Thin Film Sputtering

Sputtering may be mentioned as one preferred technique for the preparation of a thin film. Specifically, a PZT sinter comprising specific components is used as a target for sputtering to form an amorphous film as a precursor of a piezoelectric film on an electrode film by sputtering.

The amorphous precursor is crystallized by heating and sintered. Preferably, the heating is carried out in an oxygen atmosphere (for example, in oxygen or in a gas mixture of oxygen with an inorganic gas, such as argon). In the step of heating, the precursor film is heated at a temperature of preferably 500 to 700° C. in an oxygen atmosphere so as to be crystallized and brought to a crystal grain diameter in the range of from 0.005 to 0.2 $\mu$m.

The piezoelectric thin film according to the present invention can be preferably produced by the following two modified sol-gel processes.

Production Method by Sol-gel Process According to First Aspect of the Invention

Step a)

The method for producing a piezoelectric film according to the present invention is based on the sol-gel process. Specifically, the production method fundamentally comprises dehydrating a hydrated complex of a hydroxide of metal components capable of forming a piezoelectric film, that is, a sol, to give a gel and heating and sintering the gel to prepare an inorganic oxide, that is, a piezoelectric film.

In the present invention, the sol of metal components for constituting the piezoelectric film can be prepared by hydrolyzing an alkoxide or acetate of metals, capable of forming a piezoelectric film, with, for example, an acid. In the present invention, the above composition of the piezoelectric thin film can be provided by regulating the sol composition in terms of metals. Specifically, an alkoxide or acetate of each of titanium, zirconium, lead and other metal components is used as a starting material. The production method according to the present invention has an advantage that the ratio of metal components, for constituting the piezoelectric thin film, in the sol composition is substantially maintained until the piezoelectric thin film is finally provided. That is, a variation in the ratio of metal components attributable to the evaporation of metal components, especially lead component, during firing and annealing hardly occurs. Therefore, the ratio of metal components in the starting material is identical to the ratio of metals in the final piezoelectric thin film. In other words, the composition of the sol is determined according to the composition of the piezoelectric film to be produced.

According to a preferred embodiment of the present invention, in order to prepare the piezoelectric thin film which has the excessive Pb content, in the sol, the amount of the lead component is preferably up to 20% by mole, more preferably 15% by more to excess.

In the present invention, the sol composition preferably contains an organic polymer compound. The organic polymer compound absorbs the residual stress of the thin film at the time of drying and firing, enabling the creation of a crack in the thin film to be effectively prevented. More specifically, the use of a sol containing the organic polymer results in creation of pores in the gelled thin film described below. The pores are considered to absorb the residual stress of the thin film in the step of pre-annealing and annealing described below. Preferred organic polymer compounds used herein include polyvinyl acetate, hydroxypropyl cellulose, polyethylene glycol, polyethylene glycol monomethyl ether, polypropylene glycol, polyvinyl alcohol, polyacrylic acid, polyamide, polyamic acid, acetyl cellulose and derivatives thereof, and copolymers of these compounds. According to a preferred embodiment of the present invention, the addition of polyvinyl acetate enables the formation of a porous thin film of gel, with a large number of pores having a size of about 0.05 $\mu$m, and the addition of hydroxypropyl cellulose enables the formation of a porous thin film of gel, having a size of not more than 1 $\mu$m and a broad size distribution.

According to a preferred embodiment of the present invention, the polymer compound is preferably a polyethylene glycol having an average molecular weight of about 285 to 420 or a polypropylene glycol having an average molecular weight of about 300 to 800.

In the production method according to the present invention, a substrate on which a piezoelectric thin film is to be formed is first coated with the sol composition. The term "substrate" used herein is intended to mean a substrate which finally constitutes a part of a finally formed piezoelectric thin-film device. Therefore, for example, when the preparation of an ink jet recording head utilizing the piezoelectric thin film according to the present invention, which will be described later, is contemplated, a crystalline silicon having thereon a thin-film electrode is used as the substrate.

The coating method is not particularly limited and may be any conventional method commonly used in the art, for example, spin coating, dip coating, roll coating, and bar coating. Further, flexographic printing, screen printing, offset printing and other printing methods may also be used for the coating.

According to a preferred embodiment of the present invention, when the following steps are taken into consideration, the thickness of the coating formed by the above method is regulated so that the thickness of the porous thin film of gel formed in the step b) described below is preferably not less than 0.01 $\mu$m, more preferably about 0.1 to 1 $\mu$m.

The resultant coating is then dried. The drying may be carried out by air drying or by heating at a temperature of 200° C. or below.

According to a preferred embodiment of the present invention, an additional film may be coated on a dried film to increase the film thickness. In this embodiment, the underlying film is preferably dried at a temperature of 80° C. or above.

Step b)

In this step, the film, of the sol composition, formed in the step a) is gelled. Specifically, the film formed in the step a) is calcined to prepare a porous thin film of gel comprising an amorphous metal oxide and substantially free of any residual organic matter. This step is often referred herein to as the "step of calcination."

The calcination temperature and time may be such that the film of the sol composition is satisfactorily gelled and the organic matter can be satisfactorily removed from the film. According to a preferred embodiment of the present invention, the calcination temperature is preferably in the range of from 300 to 450° C., more preferably in the range of from 350 to 400° C. The calcination time may vary depending upon the type of the oven used. For example, when a degreasing oven is used, the calcination time is preferably about 10 to 120 min, more preferably about 15 to 60 min. On the other hand, when a hot plate is used, the calcination time is preferably about 1 to 60 min, more preferably about 5 to 30 min.

Figure 2:
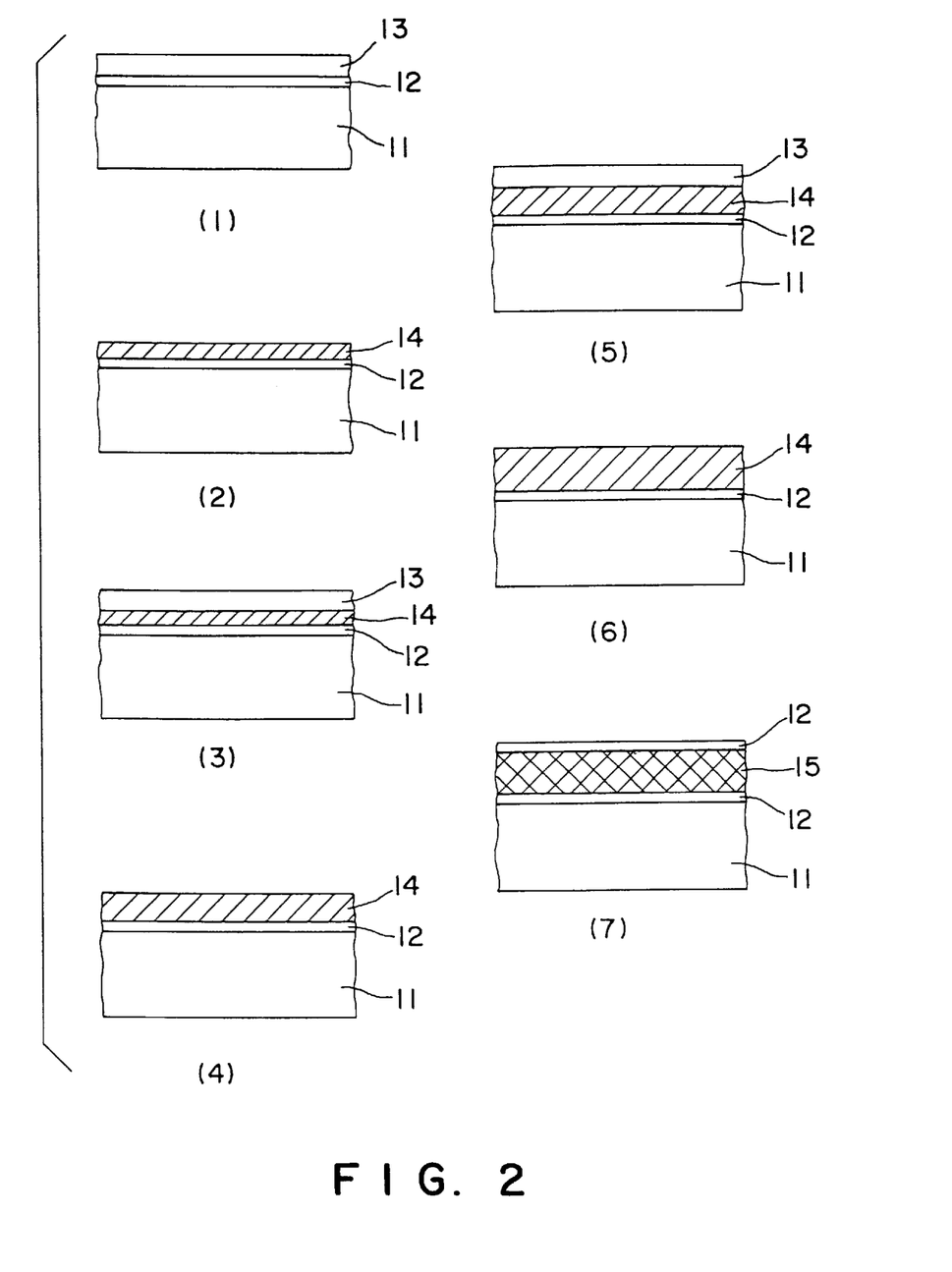
FIG. 2 is a diagram schematically showing the method for producing a piezoelectric thin film according to a first aspect of the present invention.

As shown in FIG. 2 (1), the steps a) and b) result in the formation of a porous thin film 13, of gel, on an electrode 12 provided on a substrate 11.

Step c)

In this step, the porous thin film, of gel, formed in the step b) is heated and fired, thereby converting the thin film-to a film formed of a crystalline metal oxide. This step is often referred herein to as the "step of pre-annealing."

The firing may be carried out by heating the porous thin film of gel at a temperature high enough to convert the thin film of gel to a film formed of a crystalline metal oxide. In this case, the porous thin film of gel need not be fired to such an extent that the perovskite crystal occupies the major part of the crystals. The firing may be terminated at the time when the thin film of gel has been uniformly crystallized. According to a preferred embodiment of the present invention, the firing temperature is preferably in the range of from 400 to 800° C., more preferably in the range of from 550 to 750° C. The firing time may vary depending upon the firing temperature and the type of the oven used. For example, when an annealing oven is used, the firing time is preferably about 0.1 to 5 hr, more preferably about 0.5 to 2 hr. On the other hand, when an RTA (rapid thermal annealing) oven is used, the firing time is preferably about 0.1 to 10 min, more preferably about 1 to 5 min.

Further, according to a preferred embodiment of the present invention, the pre-annealing may be carried out in two stages. Preferably, the first stage is carried out at a temperature in the range of from 400 to 600° C., and the second stage is carried out at a temperature in the range of from 600 to 800° C. According to a more preferred embodiment of the present invention, the first stage is carried out at a temperature in the range of from 450 to 550° C., and the second stage is carried out at a temperature in the range of from 600 to 750° C.

As shown in FIG. 2 (2), in the step c), the porous thin film 13 of gel is converted to a film 14 formed of a crystalline metal oxide.

Step d)

In the present invention, the steps a), b), and c) are repeated at least once to laminate a film(s) formed of a crystalline metal oxide. The film thickness, calcination temperature, and pre-annealing conditions for the repeated steps a), b), and c) may be as described above in connection with the formation of the first film on the substrate.

The thickness of the laminated film formed in this step may be suitably determined by taking the film thickness of the final piezoelectric thin film into consideration. However, it is needless to say that the thickness of the laminated film is preferably such that no cracking occurs in the following step e).

The step d) is schematically shown in FIG. 2 (3). An additional porous thin film 13 of gel is formed on the previously formed film 14, and, as shown in FIG. 2 (4), subsequent pre-annealing causes the additional porous thin film 13 of gel to be substantially united with the previously formed film 14 to form a substantially united film. In this case, the substantially united film refers to a film free from any interface attributable to the lamination, as well as a film which, unlike the final piezoelectric thin film, may have an interface of layers formed by lamination. When the steps a), b), and c) are further repeated, as shown in FIG. 2 (5), an additional porous thin film 13 of gel is formed, and, as shown in FIG. 2 (6), subsequent pre-annealing causes the additional film 13 of gel to be substantially united with the crystalline laminated film 14 to form a substantially united film.

Preferably, patterning and the formation of an upper electrode in the piezoelectric thin film are carried out in the thin film in this stage.

Step e)

In this step, the laminated film, formed of a crystalline metal oxide, thus obtained is further fired to grow perovskite crystals. This step is often referred herein to as the "step of annealing."

According to a preferred embodiment of the present invention, the firing temperature is preferably in the range of from 600 to 1200° C., more preferably in the range of from 800 to 1000° C. The firing time may vary depending upon the firing temperature and the type of the oven used. For example, when an annealing oven is used, the firing time is preferably about 0.1 to 5 hr, more preferably about 0.5 to 2 hr. On the other hand, when an RTA oven is used, the firing time is preferably about 0.1 to 10 min, more preferably about 0.5 to 3 min.

Further, according to a preferred embodiment of the present invention, the annealing may be carried out in two stages. In this case, preferably, the first stage is carried out at a temperature in the range of from 600 to 800° C., and the second stage is carried out at a temperature in the range of from 800 to 1000° C. According to a more preferred embodiment of the present invention, the first stage is carried out at a temperature in the range of from 600 to 750° C., and the second stage is carried out at a temperature in the range of from 800 to 950° C.

The above procedure can provide a piezoelectric thin film having no interface in its cross section.

According to a preferred embodiment of the present invention, in the step of annealing, the crystal grains are grown, enabling the formation of a piezoelectric thin film comprising crystal grains having an average grain diameter of 0.005 to 0.2 $\mu$m and is free from any multilayer structure in its cross section.

FIG. 2 (7) shows an embodiment of a piezoelectric thin-film device, wherein an electrode 12 is provided on the piezoelectric thin-film device 15, having no multilayer structure, formed by the above procedure.

Production Method by Sol-gel Process According to Second Aspect of the Invention Steps a) and b)

The steps a) and b) in the production method according to the second aspect of the invention are the same as those in the method for producing a piezoelectric thin film according to the first aspect of the present invention.

Figure 3:
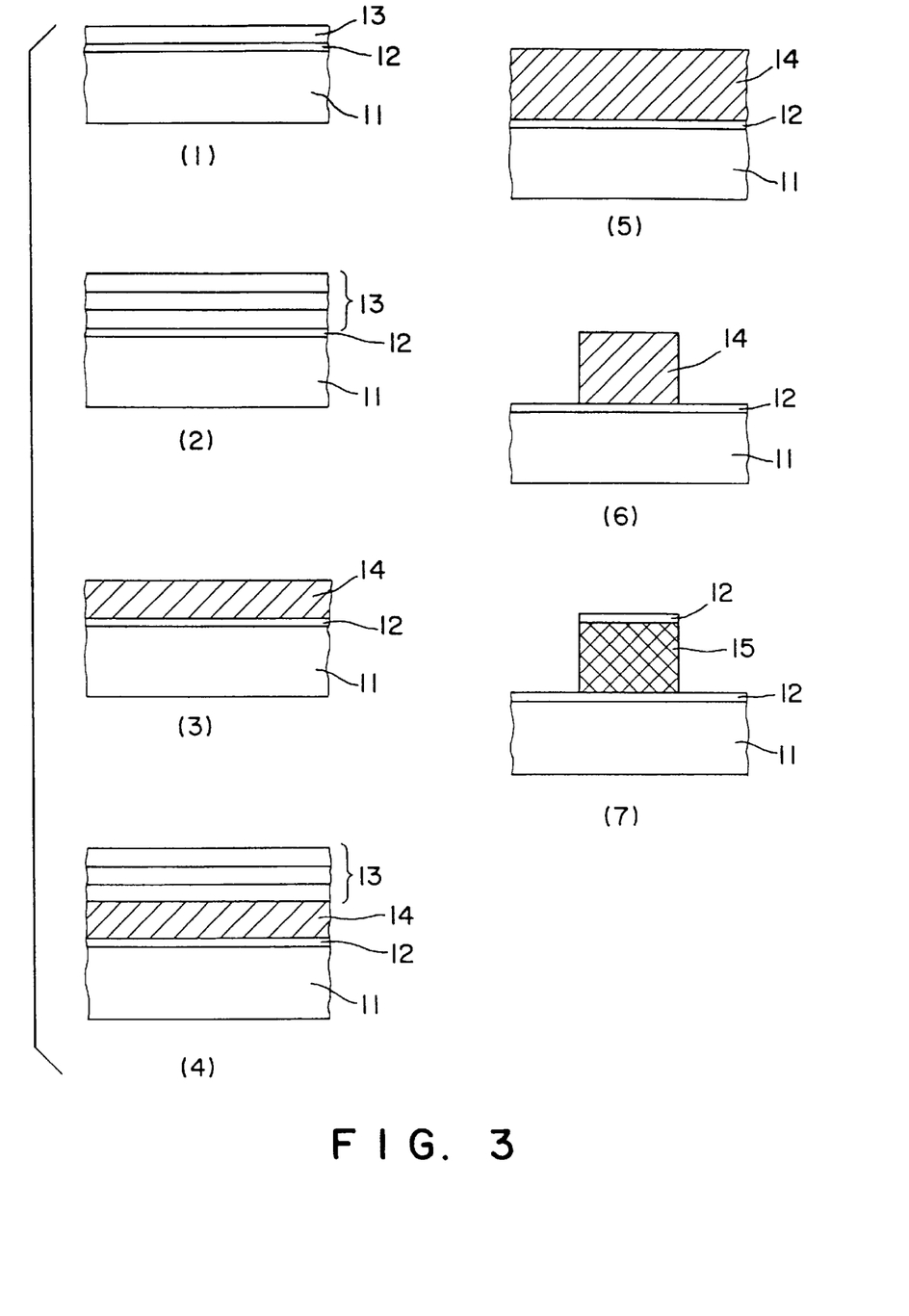
FIG. 3 is a diagram schematically showing the method for producing a piezoelectric thin film according to a second aspect of the present invention.

These steps result in a substrate 11 with an electrode 12 and a porous thin film 13 of gel formed thereon, as shown in FIG. 3 (1).

Step f)

In the method for producing a piezoelectric thin film according to the second aspect of the present invention, the steps a) and b) are repeated at least once to form a laminate of porous thin films of gel. In the repetition of the steps a) and b), the film thickness and the calcination temperature may be the same as those described above in connection with the formation of the first film on the substrate.

According to a preferred embodiment of the present invention, the thickness of the laminate of the thin films is preferably not more than 1 μm, still preferably not more than 0.5 μm. When the laminate of the thin films has the above thickness, the pre-annealing in the subsequent step c') can be efficiently carried out without creating any crack.

This step results in the formation of a laminate of a plurality of porous thin films 13 of gel, as shown in FIG. 3 (2).

Step c')

In this step, the laminate of thin films formed in the step f) is fired to convert the laminate to a film formed of a crystalline metal oxide. This step is similar to the step c) in the production method according to the first aspect of the present invention. It is often referred herein to as the "step of pre-annealing."

The firing may be carried out by heating the laminate of porous thin films of gel at a temperature high enough to convert the laminate to a film formed of a crystalline metal oxide. In this case, the laminate of the thin films need not be fired to such an extent that the perovskite crystal occupies the major part of the crystals. The firing may be terminated at the time when the laminate of the thin films has been uniformly crystallized. The firing temperature and time may be substantially the same as those in the step c) in the production method according to the first aspect of the present invention. Further, as with the step c) in the production method according to the first aspect of the present invention, the step of pre-annealing may be carried out in two stages.

As shown in FIG. 3 (3), this step results in the conversion of a laminate of porous thin films 13 of gel to a crystalline, thin film 14.

Step d')

In the production method according to the second aspect of the present invention, the steps f) and c') are repeated at least once. Specifically, a series of procedures consisting of the step f), i.e., the step of repeating the steps a) and b) at least once to form a laminate of porous thin films of gel and the step c') of firing the laminated of porous thin films of gel to convert the laminate to a film formed of a crystalline metal oxide are repeated at least once. Thus, a laminated film formed of a crystalline metal oxide is formed.

Various conditions for the repetition of the steps a) and b) and the step c') may be the same as those described above.

The thickness of the laminated film formed in this step may be suitably determined by taking the film thickness of the final piezoelectric thin film into consideration. However, it is needless to say that the thickness of the laminated film is preferably such that no cracking occurs in the following step e').

In the step d'), as shown in FIG. 3 (4), an additional laminate 13 of porous thin films of gel is formed on the previously formed film 14, and, as shown in FIG. 3 (5), subsequent pre-annealing causes the additional laminate of porous thin film 13 of gel to be substantially united with the previously formed film 14 to form a substantially united film. In this case, the substantially united film is as defined above.

Preferably, patterning and the formation of an upper electrode in the piezoelectric thin film are carried out in the thin film in this stage. FIG. 3 (6) shows a film 14 patterned into a desired form.

Step e')

In this step, the laminated film, formed of a crystalline metal oxide, thus obtained is further fired to grow perovskite crystals. This step is similar to the step e) in the production method according to the first aspect of the present invention. It is often referred herein to as the "step of annealing."

The firing temperature and time may be substantially the same as those in the step e) in the production method according to the first aspect of the present invention. Further, as with the step e) in the production method according to the first aspect of the present invention, the step of annealing may be carried out in two stages.

FIG. 3 (7) shows an embodiment of a piezoelectric thin-film device, wherein an electrode 12 is provided on the piezoelectric thin film 15, having no multilayer structure, formed by the above procedure.

Application of Piezoelectric Thin Film/Ink Jet Recording Head

The piezoelectric thin film according to the present invention may be used in various applications by taking advantage of good properties thereof.

For example, it can be used as a vibrator for an ink jet recording head. The use of the piezoelectric thin-film device according to the present invention is advantageous in that an ink can be projected at a high pressure and the ink jet recording head can be driven at a high frequency.

Figure 4:
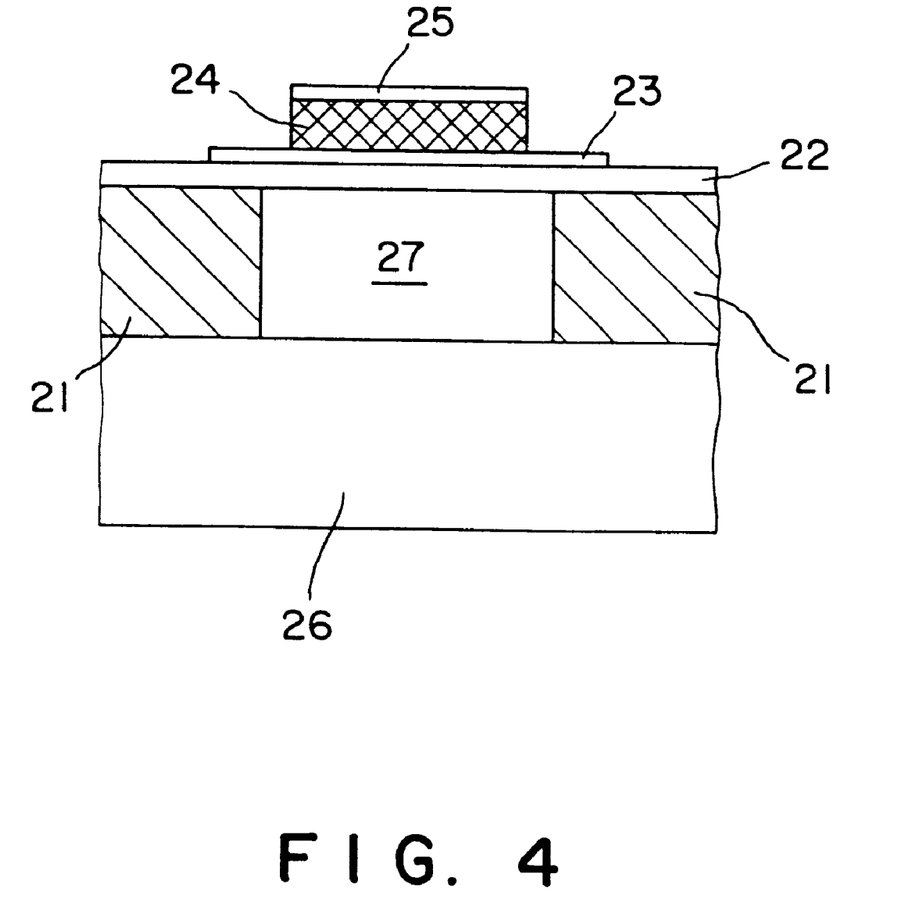
FIG. 4 is a schematic view of an ink jet recording head utilizing the piezoelectric thin film according to the present invention.

A preferred embodiment of the recording head utilizing the piezoelectric thin film according to the present invention is shown in FIG. 4. This recording head comprises a single-crystal Si substrate 21 provided with an ink reservoir 27 and joined to a second substrate 26. A diaphragm 22, a lower electrode 23, a piezoelectric film 24, and an upper electrode 25 are provided on the single-crystal Si substrate 21.

An ink is fed into the ink reservoir 27 through an ink passage (not shown). In this case, a voltage is applied to the piezoelectric film 24 through the lower electrode 23 and the upper electrode 25. The application of the voltage results in deformation of the ink reservoir 27, pressurizing the ink. The pressure projects the ink through a nozzle (not shown), enabling ink jet recording.

The ink jet recording head can be prepared by any conventional method.

EXAMPLES

Example A1

Lead acetate (0.105 mol), 0.045 mol of zirconium acetylacetonate, and 0.005 mol of magnesium acetate were heated to 100° C. and dissolved in 30 ml of acetic acid. The solution was cooled to room temperature, and a solution of 0.040 mol of titanium tetraisopropoxide and 0.010 mol of pentaethoxyniobium dissolved in 50 ml of ethyl cellosolve was added thereto. Acetyl acetone (30 ml) was added to stabilize the system, 30% by weight, based on the metal oxide in the sol, of polyethylene glycol #400 (average molecular weight 380 to 420, manufactured by Kanto Chemical Co., Inc.) was added thereto, and the mixture was thoroughly stirred to prepare a homogeneous sol.

A platinum electrode was formed on a silicon substrate by sputtering, the sol prepared above was spin-coated on the platinum electrode, and the resultant coating was calcined at 400° C. As a result, a 0.3 μm-thick amorphous porous thin film of gel could be formed without cracking. Thereafter, a series of procedures consisting of the step of further coating the sol and the step of pre-sintering the coating at 400° C. were repeated twice to form a 0.9 μm-thick laminate of porous thin films of gel. The laminate was heated to 650° C. over a period of 5 sec in an oxygen atmosphere in an RTA oven and held at that temperature for one min, thereby carrying out pre-annealing. Thus, a 0.6 μm-thick dense, thin film was formed.

The thin film thus obtained was examined by X-ray diffractometry. As a result, a diffraction pattern characteristic of a pyrochlore crystal was observed. Further, it was examined by reflection FT-IR (Fourier transform infrared absorption spectroscopy). As a result, no absorption peak, around 3400 $cm^{-1}$, attributable to a hydroxyl group was observed.

A series of procedures consisting of the step of further spin-coating the sol, prepared above, on the thin film and the step of pre-sintering the coating at 400° C. were repeated thrice to form a 0.9 μm-thick laminate of amorphous, porous, thin films of gel. Thereafter, pre-annealing was carried out in an RTA oven by holding the laminate at 650° C. for one min, thereby forming a 1.2 μm-thick, crystalline, dense, thin film.

The substrate with the thin film formed thereon was patterned using a photoresist and etched with fluoroboric acid. The resist was peeled off, and annealing was carried out in an RTA oven by holding the substrate with the thin film formed thereon in an oxygen atmosphere in an RTA oven at 900° C. for one min. Thus, a piezoelectric thin film of which the thickness was 1.2 μm, that is, remained unchanged was obtained. The piezoelectric thin film was examined by X-ray diffractometry. As a result, sharp and strong peaks attributable to a perovskite crystal were observed. Further, the silicon substrate with the thin film formed thereon was cut, and the cross section of the thin film was observed under SEM (a scanning electron micrograph). As a result, it was found that crystal grains were distributed uniformly and densely and no interface attributable to the lamination was present. Further, a thin film sample was prepared, and the piezoelectric material was observed under TEM (a transmission electron microscope). As a result, it was found that the thin film was formed of crystal grains having an average grain diameter of 0.03 μm.

An aluminum electrode was formed on the piezoelectric thin film, prepared above, by vapor deposition followed by polarization to prepare a piezoelectric thin-film device. The properties of the piezoelectric thin-film device were measured and found be to excellent. Specifically, the piezoelectric thin-film device had a specific permittivity of 2000 and a piezoelectric strain constant of 150 pC/N.

The PZT thin film was dissolved in hydrofluoric acid, and the molar ratio of Pb to Mg to Nb to Zr to Ti in the PZT thin film was determined by ICP (plasma atomic emission spectrometry) and found to be 1.00:0.05:0.10:0.45:0.40 which was the same as the molar ratio in the starting materials except for lead of which the proportion in the PZT thin film was slightly smaller than that in the starting materials.

An ink jet recording head, as shown in FIG. 3, using the piezoelectric thin film prepared above was prepared. FIG. 3 is a conceptual typical cross-sectional view showing the use of the piezoelectric thin film of the present invention in the preparation of an ink jet recording head. A diaphragm of silicon nitride was formed on a silicon wafer by sputtering, and a lower electrode and a piezoelectric thin film were then formed thereon. The resultant piezoelectric thin film was photoetched to create patterns of 0.2 mm in width and 4 mm in length, and a groove having a width of 0.3 mm was formed within the silicon wafer by anisotropic etching. An upper electrode of gold was formed on-the piezoelectric thin film, and the piezoelectric thin film was then joined to a second substrate of glass to form an ink passage 27. A head unit was cut for each substrate, and an ink jet recording head was assembled. An ink could be projected through the ink jet recording head with satisfactory projecting force. Further, the ink jet recording head was incorporated into an ink jet recording apparatus following by printing. As a result, the quality of prints was good.

Examples A2 to A5 and Comparative Examples A1 and A2

Coating liquids (six kinds) were prepared in the same manner as in Example A1, except that the molar ratio of magnesium and the molar ratio of niobium were fixed respectively to 0.067 and 0.133 with the molar ratios of zirconium and titanium varied as specified in Table 1. Further, polyethylene glycol #300 (average molecular weight 285 to 315, manufactured by Kanto Chemical Co., Inc.) was used as the polyethylene glycol. The sols were coated on a substrate electrode, and the coatings were calcined at 400° C. to form 0.3 μm-thick amorphous porous thin films of gel. A series of procedures consisting of the step of further coating the sol and the step of pre-sintering the coating at 400° C. were repeated twice to form 0.9 μm-thick porous thin films of gel. The thin films were then rapidly heated to 650° C. under an oxygen atmosphere in an RTA oven and pre-annealed at that temperature for one min. Thus, 0.6 μm-thick, crystalline, dense, thin films were prepared. The above procedure was repeated ten times (i.e., total number of coatings of sol: 30). The thin films were annealed by holding them at 850° C. for one min under an oxygen atmosphere in an RTA oven. Thus, 6 μm-thick piezoelectric thin films were prepared. An aluminum electrode was formed on the piezoelectric thin films by vapor deposition followed by polarization to prepare piezoelectric thin-film devices. The average crystal grain diameter and the piezoelectric strain constant of the piezoelectric thin-film devices were as tabulated in the following table. For all the samples, no crack was observed, and no interface attributable to the lamination was observed in the cross section.

TABLE 1

|  | Molar ratio of Zr | Molar ratio of Ti | Average crystal grain diameter (μm) | Piezoelectric strain constant (pC/N) |
| --- | --- | --- | --- | --- |
| Ex. A2 | 0.35 | 0.45 | 0.2 | 70 |
| Ex. A3 | 0.40 | 0.40 | 0.05 | 120 |
| Ex. A4 | 0.45 | 0.35 | 0.03 | 150 |
| Ex. A5 | 0.50 | 0.30 | 0.05 | 90 |
| Comp. Ex. A1 | 0.30 | 0.50 | 0.3 | 30 |
| Comp. Ex. A2 | 0.55 | 0.25 | 0.1 | 40 |

Examples A6 to A9 and Comparative Examples A3 and A4

Coating liquids (six kinds) were prepared in the same manner as in Example A1, except that the molar ratio of magnesium and the molar ratio of niobium were fixed respectively to 0.033 and 0.067 with the molar ratios of zirconium and titanium varied as specified in Table 2. A series of procedures consisting of the step of coating the sols on a substrate electrode and pre-sintering the coatings at 400° C. were repeated three times to form 0.9 μm-thick amorphous porous thin films of gel. The thin films were then pre-annealed at 550° C. for 10 min under an oxygen atmosphere in a diffusion oven. Thus, 0.6 µm-thick, crystalline, dense, thin films were prepared. The above procedure was repeated 15 times (i.e., total number of coatings of sol: 45). The thin films were annealed by holding them at 950° C. for one min under an oxygen atmosphere in an RTA oven. Thus, 9 µm-thick piezoelectric thin films were prepared. An aluminum electrode was formed on the piezoelectric thin films by vapor deposition followed by polarization to prepare piezoelectric thin-film devices. The average crystal grain diameter and the piezoelectric strain constant of the piezoelectric thin-film devices were as tabulated in the following table. For all the samples, no crack was observed, and no interface attributable to the lamination was observed in the cross section.

TABLE 2

|  | Molar ratio of Zr | Molar ratio of Ti | Average crystal grain diameter (µm) | Piezoelectric strain constant (pC/N) |
| --- | --- | --- | --- | --- |
| Ex. A6 | 0.40 | 0.50 | 0.2 | 100 |
| Ex. A7 | 0.45 | 0.45 | 0.1 | 120 |
| Ex. A8 | 0.50 | 0.40 | 0.08 | 170 |
| Ex. A9 | 0.55 | 0.35 | 0.1 | 100 |
| Comp. Ex. A3 | 0.35 | 0.55 | 0.4 | 50 |
| Comp. Ex. A4 | 0.60 | 0.30 | 0.3 | 30 |

Examples A10 to A14 and Comparative Examples A5 and A6

Coating liquids (seven kinds) were prepared in the same manner as in Example A1, except that the molar ratio of zirconium to titanium was fixed to 1:1 with the ratio of the total of magnesium and niobium varied as specified in Table 3. The molar ratio of magnesium to niobium was fixed to 1:2. The sols were coated on a substrate electrode and calcined at 350° C. to form amorphous porous thin films of gel. The thin films were then pre-annealed at 550° C. for one hr to form crystalline, dense, thin films. The above procedure was repeated four times to form thin films which were then annealed at 850° C. for 20 min while flowing oxygen into a diffusion oven. Thus, 2 µm-thick piezoelectric thin films were prepared. An aluminum electrode was formed on the piezoelectric thin films by vapor deposition followed by polarization to prepare piezoelectric thin-film devices. The average crystal grain diameter and the piezoelectric strain constant of the piezoelectric thin-film devices were as tabulated in the following table.

For all the samples, no crack was observed, and no interface attributable to the lamination was observed in the cross section.

TABLE 3

|  | Molar ratio of Mg + Nb | Molar ratio of Zr,Ti | Average crystal grain diameter (µm) | Piezoelectric strain constant (pC/N) |
| --- | --- | --- | --- | --- |
| Ex. A10 | 0.08 | 0.46 | 0.1 | 70 |
| Ex. A11 | 0.12 | 0.44 | 0.03 | 120 |
| Ex. A12 | 0.16 | 0.42 | 0.01 | 120 |
| Ex. A13 | 0.20 | 0.40 | 0.05 | 90 |
| Ex. A14 | 0.24 | 0.38 | 0.5 | 70 |
| Comp. Ex. A5 | 0.04 | 0.48 | 0.3 | 40 |
| Comp. Ex. A6 | 0.28 | 0.36 | 1.5 | 30 |

Example A15

An amorphous layer, formed of a metal oxide having the same composition as the metal oxide in Example A1 was formed in a thickness of 5 µm on a substrate electrode by sputtering. A sputter target for the metal oxide was such that the molar ratio of metals in the resultant thin film was Pb:Mg:Nb:Zr:Ti=1.00:0.05:0.10:0.45:0.40. The substrate with the amorphous layer formed thereon was annealed by holding it at 900° C. for one min under an oxygen atmosphere in an RTA oven. An aluminum electrode was formed on the resultant piezoelectric thin film by vapor deposition followed by polarization to prepare piezoelectric thin-film device. The piezoelectric thin-film device had an average crystal grain diameter of 0.05 µm. It exhibited excellent properties, that is, a specific permittivity of 1800 and a piezoelectric strain constant of 140 pC/N.

An ink jet recording head using this piezoelectric thin-film device was assembled in the same manner as in Example A1, and an ink was projected through the ink jet recording head. As a result, satisfactory projecting force could be obtained. Further, the ink jet recording head was incorporated into an ink jet recording apparatus following by printing. As a result, the quality of prints was good.

Comparative Example A7

A piezoelectric thin-film device was prepared in the same manner as in Example A1, except that the annealing in an RTA oven was carried out at 750° C. The average diameter of crystal grains of the piezoelectric thin-film device was less than 0.005 µm and cannot be determined. The specific permittivity was as small as 800, and the piezoelectric strain constant was 40 pC/N.

Comparative Example A8

A piezoelectric thin-film device was prepared in the same manner as in Example A1, except that the annealing in an RTA oven was carried out at 1100° C. The lead content of the piezoelectric thin-film device was about 20% lower than that of the piezoelectric thin-film device prepared in Example A1. The average diameter of crystal grains was as large as 0.5 µm. Further, the piezoelectric thin-film device had a specific permittivity of 800 and a piezoelectric strain constant of 20 pC/N.

Comparative Example A9

The same coating liquid as used in Example A1 was coated on the same substrate as used in Example A1. The coated substrate was calcined at 400° C. to form an amorphous porous thin film of gel. The thin film was annealed by holding it at 900° C. for one min under an oxygen atmosphere in an RTA oven to prepare a 0.2 µm-thick piezoelectric thin film. The above annealing step was repeated 6 times to prepare a 1.2 µm-thick piezoelectric thin film. No crack was created in the thin film. A piezoelectric thin-film device was prepared in the same manner as in Example A1, except that the thin film prepared above was used. The piezoelectric thin film comprised crystal grains having an average diameter of 0.05 µm and had a specific permittivity of 1200 and a piezoelectric strain constant of 60 pC/N. Further, the observation of the cross section of the thin film under SEM has revealed the presence of an interface, attributable to the lamination, at intervals of 0.2 µm. Further, it was difficult to photoetch this thin film.

The lead concentration of the thin film was lower than that of the thin film prepared in Example A1. Further, a lead concentration distribution was created in the direction of the thickness, and the composition of the thin film was different from that of the sol.

Example B1

Lead acetate (0.105 mol), 0.045 mol of zirconium acetylacetonate, and 0.005 mol of magnesium acetate were heated to 100° C. and dissolved in 30 ml of acetic acid. The solution was cooled to room temperature, and a solution of 0.040 mol of titanium tetraisopropoxide and 0.010 mol of pentaethoxyniobium dissolved in 50 ml of ethyl cellosolve was added thereto. Acetyl acetone (30 ml) was added to stabilize the system, 30% by weight, based on the metal oxide in the sol, of polypropylene glycol (average molecular weight 400, manufactured by Kanto Chemical Co., Inc.) was added thereto, and the mixture was thoroughly stirred to prepare a homogeneous sol.

A platinum electrode was formed on a silicon substrate by sputtering, the sol prepared above was spin-coated on the platinum electrode, and the resultant coating was calcined at 400° C. As a result, a 0.3 µm-thick amorphous porous thin film of gel could be formed without cracking. Thereafter, a series of procedures consisting of the step of further coating the sol and the step of pre-sintering the coating at 400° C. were repeated twice to form a 0.9 µm-thick laminate of porous thin films of gel. The laminate was heated to 650° C. over a period of 5 sec in an oxygen atmosphere in an RTA oven and held at that temperature for one min, thereby carrying out pre-annealing. Thus, a 0.6 µm-thick dense, thin film was formed. The thin film thus obtained was examined by X-ray diffractometry. As a result, a diffraction pattern characteristic of a pyrochlore crystal was observed. Further, it was examined by reflection FT-IR (Fourier transform infrared absorption spectroscopy). As a result, no absorption peak, around 2900 $cm^{-1}$, attributable to a methylene group was observed.

A series of procedures consisting of the step of further spin-coating the sol, prepared above, on the thin film and the step of pre-sintering the coating at 400° C. were repeated thrice to form a 0.9 µm-thick laminate of amorphous, porous, thin films of gel. Thereafter, pre-annealing was carried out in an RTA oven by holding the laminate at 650° C. for one min, thereby forming a 1.2 µm-thick, crystalline, dense, thin film.

The substrate with the thin film formed thereon was patterned using a photoresist and etched with fluoroboric acid. The resist was peeled off, and annealing was carried out in an RTA oven by holding the substrate with the thin film formed thereon in an oxygen atmosphere in an RTA oven at 900° C. for one min. Thus, a piezoelectric thin film of which the thickness was 1.2 µm, that is, remained unchanged was obtained. The piezoelectric thin film was examined by X-ray diffractometry. As a result, sharp and strong peaks attributable to a perovskite crystal were observed. Further, the silicon substrate with the thin film formed thereon was cut, and the cross section of the thin film was observed under SEM (a scanning electron micrograph). As a result, it was found that crystal grains were distributed uniformly and densely and no interface attributable to the lamination was present. Further, a thin film sample was prepared, and the piezoelectric material was observed under TEM (a transmission electron microscope). As a result, it was found that the thin film was formed of crystal grains having an average grain diameter of 0.03 µm. Further, no crack was created in the thin film.

An aluminum electrode was formed on the piezoelectric thin film, prepared above, by vapor deposition followed by polarization to prepare a piezoelectric thin-film device. The properties of the piezoelectric thin-film device were measured and found to be excellent. Specifically, the piezoelectric thin-film device had a specific permittivity of 2000 and a piezoelectric strain constant of 150 pC/N.

The PZT thin film was dissolved in hydrofluoric acid, and the molar ratio of Pb to Mg to Nb to Zr to Ti in the PZT thin film was determined by ICP (plasma atomic emission spectrometry) and found to be 1.00:0.05:0.10:0.45:0.40 which was the same as the molar ratio in the starting materials except for lead of which the proportion in the PZT thin film was slightly smaller than that in the starting materials.

An ink jet recording head using the piezoelectric thin film prepared above was prepared in the same manner as in Example A1.

An ink could be projected through the ink jet recording head with satisfactory projecting force. Further, the ink jet recording head was incorporated into an ink jet recording apparatus following by printing. As a result, the quality of prints was good.

Examples B2

A coating liquid was prepared in the same manner as in Example B1, except that the molar ratio of magnesium was 0.067, the molar ratio of niobium was 0.133, the molar ratio of zirconium was 0.45, the molar ratio of titanium was 0.35, and polyethylene glycol (average molecular weight 750) was added in an amount of 30% by weight based on the metal oxide in the sol. The sol was coated on a substrate electrode, and the coating was calcined at 400° C. for . . . hr to form a 0.3 µm-thick amorphous porous thin film of gel. A series of procedures consisting of the step of further coating the sol and the step of pre-sintering the coating at 400° C. were repeated twice to form a 0.9 µm-thick porous thin film of gel. The thin film was then rapidly heated to 650° C. under an oxygen atmosphere in an RTA oven and pre-annealed at that temperature for one min. Thus, a 0.6 µm-thick, crystalline, dense, thin film was prepared. The above procedure was repeated ten times (i.e., total number of coatings of sol:30). The thin film was annealed by holding it at 850° C. for one min under an oxygen atmosphere in an RTA oven. Thus, a 6 µm-thick piezoelectric thin film was prepared. An aluminum electrode was formed on the piezoelectric thin film by vapor deposition followed by polarization to prepare a piezoelectric thin-film device.

The average crystal grain diameter of the piezoelectric thin film was 0.03 µm, and the piezoelectric thin film had a piezoelectric strain constant of 150 pC/N. No crack was created in the thin film. Further, no interface attributable to the lamination was observed in the cross section.

Example B3

A coating liquid was prepared in the same manner as in Example B1, except that the molar ratio of magnesium was 0.033, the molar ratio of niobium was 0.067, the molar ratio of zirconium was 0.5, the molar ratio of titanium was 0.4, and polypropylene glycol (average molecular weight 400) was added in an amount of 20% by weight based on the metal oxide in the sol. A series of procedures consisting of the step of coating the sols on a substrate electrode and pre-sintering the coatings at 400° C. are repeated thrice to form a 0.9 µm-thick amorphous porous thin film of gel. The thin film was then pre-annealed at 550° C. for 10 min under an oxygen atmosphere in a diffusion oven. Thus, a 0.6 µm-thick, crystalline, dense, thin film was prepared. The above procedure was repeated 15 times (i.e., total number of coatings of sol:45). The thin film was annealed by holding it at 950° C. for one min under an oxygen atmosphere in an RTA oven. Thus, a 12 µm-thick piezoelectric thin film was prepared. An aluminum electrode was formed on the piezoelectric thin film by vapor deposition followed by polarization to prepare a piezoelectric thin-film device.

The average crystal grain diameter of the piezoelectric thin film was 0.08 µm, and the piezoelectric thin film had a piezoelectric strain constant of 170 pC/N. No crack was created in the thin film. Further, no interface attributable to the lamination was observed in the cross section.

Example B4

A coating liquid was prepared in the same manner as in Example B1, except that the molar ratio of magnesium was 0.04, the molar ratio of niobium was 0.08, the molar ratio of zirconium was 0.22, the molar ratio of titanium was 0.22, and polypropylene glycol (average molecular weight 400) was added in an amount of 40% by weight based on the metal oxide in the sol. The sol was coated on a substrate electrode, and the coating was calcined at 350° C. to form an amorphous porous thin film of gel. The thin film was then pre-annealed at 550° C. for one hr to prepare a crystalline, dense, thin film was prepared. The above procedure was repeated forty times. The substrate with the thin film formed thereon was annealed at 850° C. for 20 min while flowing oxygen into a diffusion oven. Thus, a 20 µm-thick piezoelectric thin film was prepared. An aluminum electrode was formed on the piezoelectric thin film by vapor deposition followed by polarization to prepare a piezoelectric thin-film device.

The average crystal grain diameter of the piezoelectric thin film was 0.03 µm, and the piezoelectric thin film had a piezoelectric strain constant of 120 pC/N. No crack was created in the thin film. Further, no interface attributable to the lamination was observed in the cross section.

Example C1

Lead acetate (0.105 mol), 0.045 mol of zirconium acetylacetonate, and 0.005 mol of magnesium acetate were heated to 100° C. and dissolved in 30 ml of acetic acid. The solution was cooled to room temperature, and a solution of 0.040 mol of titanium tetraisopropoxide and 0.010 mol of pentaethoxyniobium dissolved in 50 ml of ethyl cellosolve was added thereto. Acetyl acetone (30 ml) was added to stabilize the system, 30% by weight, based on the metal oxide in the sol, of polyethylene glycol #400 (average molecular weight 380 to 420, manufactured by Kanto Chemical Co., Inc.) was added thereto, and the mixture was thoroughly stirred to prepare a homogeneous sol.

A platinum electrode was formed on a silicon substrate by sputtering, the sol prepared above was spin-coated on the platinum electrode, and the resultant coating was calcined at 400° C. As a result, a 0.3 µm-thick amorphous porous thin film of gel could be formed without cracking. Thereafter, a series of procedures consisting of the step of further coating the sol and the step of pre-sintering the coating at 400° C. were repeated twice to form a 0.9 µm-thick laminate of porous thin films of gel. The laminate was heated to 500° C. over a period of 5 sec under an oxygen atmosphere in an RTA oven, held at that temperature for 5 min, heated to 700° C., and held at that temperature for one min, thereby carrying out pre-annealing. Thus, a 0.6 µm-thick dense, thin film was formed. The thin film thus obtained was examined by X-ray diffractometry. As a result, a diffraction pattern characteristic of a pyrochlore crystal was observed. Further, it was examined by reflection FT-IR (Fourier transform infrared absorption spectroscopy). As a result, no absorption peak, around 2900 cm$^{-1}$, attributable to a methylene group was observed.

A series of procedures consisting of the step of further spin-coating the sol, prepared above, on the thin film and the step of pre-sintering the coating at 400° C. were repeated thrice to form a 0.9 µm-thick laminate of amorphous, porous, thin films of gel. Thereafter, pre-annealing was carried out in an RTA oven by holding the laminate at 500° C. for 5 min and then holding it at 700° C. for one min, thereby forming a 1.2 µm-thick, crystalline, dense, thin film. The substrate with the thin film formed thereon was patterned using a photoresist and etched with fluoroboric acid. The resist was peeled off, and, under an oxygen atmosphere in an RTA oven, the substrate with the thin film formed thereon was held at 600° C. for 5 min and then held at 900° C. for one min, thereby carrying out annealing. Thus, a piezoelectric thin film of which the thickness was 1.2 µm, that is, remained unchanged was obtained. The piezoelectric thin film was examined by X-ray diffractometry. As a result, sharp and strong peaks attributable to a perovskite crystal were observed. Further, the substrate with the thin film formed thereon was cut, and the cross section of the thin film was observed under SEM (a scanning electron micrograph). As a result, it was found that crystal grains were distributed uniformly and densely and no interface attributable to the lamination was present. Further, the thin film was observed under TEM (a transmission electron microscope). As a result, it was found that the thin film was formed of crystal grains having an average grain diameter of 0.03 µm. Further, no crack was created in the thin film.

An aluminum electrode was formed on the piezoelectric thin film, prepared above, by vapor deposition followed by polarization to prepare a piezoelectric thin-film device. The properties of the piezoelectric thin-film device were measured and found be to excellent. Specifically, the piezoelectric thin-film device had a specific permittivity of 2000 and a piezoelectric strain constant of 160 pC/N.

The PZT thin film was dissolved in hydrofluoric acid, and the molar ratio of Pb to Mg to Nb to Zr to Ti in the PZT thin film was determined by ICP (plasma atomic emission spectrometry) and found to be 1.00:0.05:0.10:0.45:0.40 which was the same as the molar ratio in the starting materials except for lead of which the proportion in the PZT thin film was slightly smaller than that in the starting materials.

An ink jet recording head using the piezoelectric thin film prepared above was prepared in the same manner as in Example A1. An ink could be projected through the ink jet recording head with satisfactory projecting force. Further, the ink jet recording head was incorporated into an ink jet recording apparatus following by printing. As a result, a good print could be obtained.

Examples C2

A coating liquid was prepared in the same manner as in Example C1, except that the molar ratio of magnesium was 0.067, the molar ratio of niobium was 0.133, the molar ratio of zirconium was 0.45, the molar ratio of titanium was 0.35, and polyethylene glycol #300 (average molecular weight 285 to 315, a reagent manufactured by Kanto Chemical Co., Inc.) was added in an amount of 30% by weight based on the metal oxide in the sol. The sol was coated on a substrate electrode, and the coating was calcined at 400° C. to form a 0.3 µm-thick amorphous porous thin film of gel. A series of procedures consisting of the step of further coating the sol and the step of pre-sintering the coating at 400° C. were repeated twice to form a 0.9 µm-thick porous thin film of gel. Under an oxygen atmosphere in an RTA oven, the thin film was then rapidly heated to 600° C., held at that temperature for 5 min, heated to 725° C., and held at that temperature for one min, thereby carrying out pre-annealing. Thus, a 0.6 µm-thick, crystalline, dense, thin film was prepared. The above procedure was repeated ten times (i.e., total number of coatings of sol:30). Under an oxygen atmosphere in an RTA oven, the thin film was held at 650° C. for 5 min and then held at 900° C. for one min, thereby carrying out annealing. Thus, a 6 µm-thick piezoelectric thin film was prepared. An aluminum electrode was formed on the piezoelectric thin film by vapor deposition followed by polarization to prepare a piezoelectric thin-film device.

The average crystal grain diameter of the piezoelectric thin film was 0.03 µm, and the piezoelectric thin-film device had a piezoelectric strain constant of 165 pC/N. No crack was created in the thin film. Further, no interface attributable to the lamination was observed in the cross section.

Example C3

A coating liquid was prepared in the same manner as in Example C1, except that the molar ratio of magnesium was 0.033, the molar ratio of niobium was 0.067, the molar ratio of zirconium was 0.5, the molar ratio of titanium was 0.4, and polyethylene glycol #400 (average molecular weight 380 to 420, a reagent manufactured by Kanto Chemical Co., Inc.) was added in an amount of 20% by weight based on the metal oxide in the sol. A series of procedures consisting of the step of coating the sols on a substrate electrode and pre-sintering the coatings at 400° C. are repeated thrice to form a 0.9 µm-thick amorphous porous thin film of gel. Under an oxygen atmosphere in a diffusion oven, the thin film was heated at 500° C., held at that temperature for 5 min, heated to 650° C., and held at that temperature for 10 min, thereby carrying out pre-annealing. Thus, a 0.6 µm-thick, crystalline, dense, thin film was prepared. The above procedure was repeated 15 times (i.e., total number of coatings of sol:45). Under an oxygen atmosphere in an RTA oven, the thin film was held at 700° C. for 5 min and then held at 950° C. for one min, thereby carrying out annealing. Thus, a 12 µm-thick piezoelectric thin film was prepared. An aluminum electrode was formed on the piezoelectric thin film by vapor deposition followed by polarization to prepare a piezoelectric thin-film device.

The average crystal grain diameter of the piezoelectric thin film was 0.08 µm, and the piezoelectric thin-film device had a piezoelectric strain constant of 170 pCIN. No crack was created in the thin film. Further, no interface attributable to the lamination was observed in the cross section.

Example D1

Lead acetate (0.110 mol; 10% by mol to excess), 0.045 mol of zirconium acetylacetonate, and 0.005 mol of magnesium acetate were heated to 100° C. and dissolved in 30 ml of acetic acid. The solution was cooled to room temperature, and a solution of 0.040 mol of titanium tetraisopropoxide and 0.010 mol of pentaethoxyniobium dissolved in 50 ml of ethyl cellosolve was added thereto. Acetyl acetone (30 ml) was added to stabilize the system, 30% by weight, based on the metal oxide in the sol, of polyethylene glycol #400 (average molecular weight 380 to 420, a reagent manufactured by Kanto Chemical Co., Inc.) was added thereto, and the mixture was thoroughly stirred to prepare a homogeneous sol.

A platinum electrode was formed on a silicon substrate by sputtering, the sol prepared above was spin-coated on the platinum electrode, and the resultant coating was calcined at 400° C. As a result, a 0.3 µm-thick amorphous porous thin film of gel could be formed without cracking. Thereafter, a series of procedures consisting of the step of further coating the sol and the step of pre-sintering the coating at 400° C. were repeated twice to form a 0.9 µm-thick laminate of porous thin films of gel. The laminate was heated to 650° C. over a period of 5 sec in an oxygen atmosphere in an RTA oven and held at that temperature for one min, thereby carrying out pre-annealing. Thus, a 0.6 µm-thick dense, thin film was formed. The thin film thus obtained was examined by X-ray diffractometry. As a result, a diffraction pattern characteristic of a pyrochlore crystal was observed. Further, it was examined by reflection FT-IR (Fourier transform infrared absorption spectroscopy). As a result, no absorption peak, around 2900 $cm^{-1}$, attributable to a methylene group was observed.

A series of procedures consisting of the step of further spin-coating the sol, prepared above, on the thin film and the step of pre-sintering the coating at 400° C. were repeated thrice to form a 0.9 µm-thick laminate of amorphous, porous, thin films of gel. Thereafter, pre-annealing was carried out in an RTA oven by holding the laminate at 650° C. for one min, thereby forming a 1.2 µm-thick, crystalline, dense, thin film.

The substrate with the thin film formed thereon was patterned using a photoresist and etched with fluoroboric acid. The resist was peeled off, and annealing was carried out in an RTA oven by holding the substrate with the thin film formed thereon in an oxygen atmosphere in an RTA oven at 900° C. for one min. Thus, a piezoelectric thin film of which the thickness was 1.2 µm, that is, remained unchanged was obtained. The piezoelectric thin film was examined by X-ray diffractometry. As a result, sharp and strong peaks attributable to a perovskite crystal were observed. Further, the silicon substrate with the thin film formed thereon was cut, and the cross section of the thin film was observed under SEM (a scanning electron micrograph). As a result, it was found that crystal grains were distributed uniformly and densely and no interface attributable to the lamination was present. Further, a thin film sample was prepared, and the piezoelectric material was observed under TEM (a transmission electron microscope). As a result, it was found that the thin film was formed of crystal grains having an average grain diameter of 0.06 µm. Further, no crack was created in the thin film.

An aluminum electrode was formed on the piezoelectric thin film, prepared above, by vapor deposition followed by polarization to prepare a piezoelectric thin-film device. The properties of the piezoelectric thin-film device were measured and found be to excellent. That is, the piezoelectric thin-film device had a specific permittivity of 2300 and a piezoelectric strain constant of 170 pC/N.

The PZT thin film was dissolved in hydrofluoric acid, and the molar ratio of Pb to Mg to Nb to Zr to Ti in the PZT thin film was determined by ICP (plasma atomic emission spectrometry) and found to be 1.04:0.05:0.10:0.45:0.40 which was the same as the molar ratio in the starting materials except for lead of which the proportion in the PZT thin film was slightly smaller than that in the starting materials.

An ink jet recording head using the piezoelectric thin-film device prepared above was prepared in the same manner as in Example Al. An ink could be projected through the ink jet recording head with satisfactory projecting force. Further, the ink jet recording head was incorporated into an ink jet recording apparatus following by printing. As a result, the quality of prints was good.

Example D2

A coating liquid was prepared in the same manner as in Example D1, except that the amount of the lead component was 15% by mol to excess, the molar ratio of magnesium was 0.067, the molar ratio of niobium was 0.133, the molar ratio of zirconium was 0.45, the molar ratio of titanium was 0.35, and polyethylene glycol #300 (average molecular weight 285 to 315, a reagent manufactured by Kanto Chemical Co., Inc.) was added in an amount of 30% by weight based on the metal oxide in the sol. The sol was coated on a substrate electrode, and the coating was calcined at 400° C. to form a 0.3 µm-thick amorphous porous thin film of gel. A series of procedures consisting of the step of further coating the sol and the step of pre-sintering the coating at 400° C. were repeated twice to form a 0.9 µm-thick porous thin film of gel. Under an oxygen atmosphere in an RTA oven, the thin film was then rapidly heated to 650° C. and held at that temperature for one min, thereby carrying out pre-annealing. Thus, a 0.6 µm-thick, crystalline, dense, thin film was prepared. The above procedure was repeated ten times (i.e., total number of coatings of sol:30). Thus, a 6 µm-thick piezoelectric thin film was obtained. Under an oxygen atmosphere in an RTA oven, the thin film was held at 850° C. for one min to carry out annealing. An aluminum electrode was formed on the piezoelectric thin film by vapor deposition followed by polarization to prepare a piezoelectric thin-film device.

The average crystal grain diameter of the piezoelectric thin-film device was 0.05 µm, and the piezoelectric thin film had a specific permittivity of 2400 and a piezoelectric strain constant of 175 pC/N. No crack was created in the thin film. Further, no interface attributable to the lamination was observed in the cross section.

Example D3

A coating liquid was prepared in the same manner as in Example D1, except that the amount of the lead component was 20% by mol to excess, the molar ratio of magnesium was 0.033, the molar ratio of niobium was 0.067, the molar ratio of zirconium was 0.5, the molar ratio of titanium was 0.4, and polyethylene glycol #400 (average molecular weight 380 to 420, a reagent manufactured by Kanto Chemical Co., Inc.) was added in an amount of 20% by weight based on the metal oxide in the sol. A series of procedures consisting of the step of coating the sol on a substrate electrode and pre-sintering the coating at 400° C. were repeated thrice to form a 0.9 µm-thick amorphous porous thin film of gel. The thin film was pre-annealed at 550° C. for 10 min. Thus, a 0.6 µm-thick, crystalline, dense, thin film was prepared. The above procedure was repeated 15 times (i.e., total number of coatings of sol:45). Thus, a 12 µm-thick piezoelectric thin film was obtained. Under an oxygen atmosphere in an RTA oven, the thin film was held at 950° C. for one min to carry out annealing. An aluminum electrode was formed on the piezoelectric thin film by vapor deposition followed by polarization to prepare a piezoelectric thin-film device.

The average crystal grain diameter of the piezoelectric thin film was 0.08 µm, and the piezoelectric thin film had a specific permittivity of 2300 and a piezoelectric strain constant of 185 pC/N. No crack was created in the thin film. Further, no interface attributable to the lamination was observed in the cross section.

Example E1

Bismuth acetate (0.002 mol), 0.103 mol of lead acetate, 0.045 mol of zirconium acetylacetonate, and 0.005 mol of magnesium acetate were heated to 100° C. and dissolved in 30 ml of acetic acid. The solution was cooled to room temperature, and a solution of 0.040 mol of titanium tetraisopropoxide and 0.010 mol of pentaethoxyniobium dissolved in 50 ml of ethyl cellosolve was added thereto. Acetyl acetone (30 ml) was added to stabilize the system, 30% by weight, based on the metal oxide in the sol, of polyethylene glycol was added thereto, and the mixture was thoroughly stirred to prepare a homogeneous sol.

A platinum electrode was formed on a silicon substrate by sputtering, the sol prepared above was spin-coated on the platinum electrode, and the resultant coating was calcined at 400° C. As a result, a 0.3 µm-thick amorphous porous thin film of gel could be formed without cracking. Thereafter, a series of procedures consisting of the step of further coating the sol and the step of pre-sintering the coating at 400° C. were repeated twice to form a 0.9 µm-thick laminate of porous thin films of gel. The laminate was heated to 650° C. over a period of 5 sec in an oxygen atmosphere in an RTA oven and held at that temperature for one min, thereby carrying out pre-annealing. Thus, a 0.6 µm-thick dense, thin film was formed. The thin film thus obtained was examined by X-ray diffractometry. As a result, a diffraction pattern characteristic of a pyrochlore crystal was observed. Further, it was examined by reflection FT-IR. As a result, no absorption peak, around 3400 $cm^{-1}$, attributable to a hydroxyl group was observed.

A series of procedures consisting of the step of further spin-coating the sol, prepared above, on the thin film and the step of pre-sintering the coating at 400° C. were repeated thrice to form a 0.9 µm-thick laminate of amorphous, porous, thin films of gel. Thereafter, pre-annealing was carried out in an RTA oven by holding the laminate at 650° C. for one min, thereby forming a 1.2 µm-thick, crystalline, dense, thin film.

The substrate with the thin film formed thereon was patterned using a photoresist and etched with fluoroboric acid. The resist was peeled off, and annealing was carried out in an RTA oven by holding the substrate with the thin film formed thereon under an oxygen atmosphere in. an RTA oven at 900° C. for one min. Thus, a piezoelectric thin film of which the thickness was 1.2 µm, that is, remained unchanged was obtained. The piezoelectric thin film was examined by X-ray diffractometry. As a result, sharp and strong peaks attributable to a perovskite crystal were observed. Further, the silicon substrate with the thin film formed thereon was cut, and the cross section of the thin film was observed under SEM (a scanning electron micrograph). As a result, it was found that crystal grains were distributed uniformly and densely and no interface attributable to the lamination was present. Further, a thin film sample was prepared, and the piezoelectric material was observed under TEM (a transmission electron microscope). As a result, it was found that the thin film was formed of crystal grains having an average grain diameter of 0.03 µm. The PZT thin film was dissolved in hydrofluoric acid, and the molar ratio of Pb to Bi to Mg to Nb to Zr to Ti in the PZT thin film was determined by ICP (plasma atomic emission spectrometry) and found to be 0.98:0.02:0.05:0.10:0.45:0.40 which was the same as the molar ratio in the starting materials except for lead of which the proportion in the PZT thin film was slightly smaller than that in the starting materials.

The above composition of the PZT thin film (piezoelectric thin film) prepared in the present example can be rewritten as (Pb+Bi) to Mg to Nb to Zr to Ti=1.00:0.05:0.10:0.45:0.40 which was identical to the composition in Example A1. Specifically, the composition of the piezoelectric thin film prepared in Example E1 was such that 2% of Pb in Example A1 was replaced with Bi. An aluminum electrode was formed on the piezoelectric thin film, prepared above, by vapor deposition followed by polarization to prepare a piezoelectric thin-film device. The properties of the piezoelectric thin-film device were measured. As a result, the specific permittivity was 1000, and the piezoelectric strain constant was 120 pC/N.

Comparison of the properties of the piezoelectric thin film prepared in the present example with those of the piezoelectric thin film prepared in Example A1 reveals that the piezoelectric thin film prepared in the present example is 50% lower for the specific permittivity and 20% lower than that prepared in Example A1. The piezoelectric thin film prepared in the present example is very advantageous from the viewpoint of heat generation in an ink jet recording head wherein the area occupied by the piezoelectric thin-film device has been increased.

An ink jet recording head was prepared using the piezoelectric thin-film device thus obtained. The size of the piezoelectric thin film and the size of the ink passage were identical to those in Example A1. The applied voltage was increased by 20% in order to compensate for shortage of the piezoelectric strain property of the piezoelectric thin film. This results in a 75% reduction in the amount of heat generated in the piezoelectric thin film at the time of driving without sacrificing the property on the direction of an ink projected. Further, the volume of the ink passage was increased in order to increase the amount of the ink droplets projected. Specifically, the width of the ink passage was changed from 0.3 mm to 0.4 mm, and the width of the piezoelectric thin film was changed from 0.2 mm to 0.3 mm. This increased the area of the piezoelectric thin film, that is, capacitor, by 50%. Since, however, the specific permittivity was small, the capacity of the capacitor was reduced by 25%, enabling a reduction in heat generation.

Example E2

A piezoelectric thin film was formed in the same manner as in Example E1, except that 0.005 mol of lanthanum acetate, 0.998 mol of lead acetate, 0.045 mol of zirconium acetylacetonate, 0.005 mol of magnesium acetate, 0.040 mol of titanium tetraisopropoxide, and 0.010 mol of pentaethoxyniobium were used as raw materials for the sol.

The resultant piezoelectric thin film had a composition having a molar ratio of Pb to La to Mg to Nb to Zr to Ti of 0.95:0.05:0.05 0.10:0.45:0.40 which can rewritten as (Pb+La) to Mg to Nb to Zr to Ti of 1.00:0.05:0.10:0.45:0.40. That is, the composition of the piezoelectric thin film prepared in the present example was such that 5% of Pb in Example A1 was replaced with La. The piezoelectric properties of the piezoelectric thin film were measured after polarization. As a result, the specific permittivity was 2500, and the piezoelectric strain constant was 140 pC/N. The Young's modulus Y of the piezoelectric thin film was $5 \times 10^{10}$ Pa, demonstrating that the piezoelectric thin film was softer than the piezoelectric thin film, prepared in Example A1, having a Young's modulus Y of $6 \times 10^{10}$ Pa.

Example E3 to E15

Piezoelectric thin films formed of a piezoelectric material represented by the chemical formula $xPb(Mg_{1/3}Nb_{2/3})O_3$-$yPbZrO_3$-$zPbTiO_3$ wherein x, y, and z represent the molar ratio, provided that x+y+z=1, and wherein part of Pb, Zr, Ti, and Nb and part or the whole of Mg in the chemical formula had been replaced with other element(s) were prepared in the same manner as in Example E2.

The specific permittivity and the Young's modulus of the piezoelectric thin films wherein Pb had been replaced with Sr, Ca, or Ba were as tabulated in Table 4. Regarding raw materials for the sol, diethoxystrontium was used for Sr, and calcium acetate and barium acetate were used respectively for Ca and Ba.

The specific permittivity and the Young's modulus of the piezoelectric thin films wherein Zr and Ti had been replaced with Sb, Fe, Al, or Cr were as tabulated in Table 5. Regarding raw materials for the sol, triethoxyantimony was used for Sb, and iron acetate, aluminum acetate, and chromium acetate were used respectively for Fe, Al, and Cr.

The specific permittivity and the Young's modulus of the piezoelectric thin films wherein Mg had been replaced with Co, Zn, Mn, or Ni were as tabulated in Table 6. Regarding raw materials for the sol, cobalt acetate, zinc acetate, manganese acetate, and nickel acetate were used respectively for Co, Zn, Mn, and Ni.

The specific permittivity and the Young's modulus of the piezoelectric thin films wherein Nb had been replaced with Ta or Sb were as tabulated in Table 7. Regarding raw materials for the sol, triethoxyantimony and pentamethoxytantalum were used.

TABLE 4

| | Replacement element | Replacement ratio | Average crystal grain diameter ($\mu$m) | Specific permittvity | Young's modulus (Pa) |
|---|---|---|---|---|---|
| Ex. E3 | Sr | Not more than 0.2 | 0.1 | Not less than 2200 | 7-9E10 |
| Ex. E4 | Ca | Not more than 0.2 | 0.06 | Not less than 2500 | 7-9E10 |
| Ex. E5 | Ba | Not more than 0.2 | 0.07 | Not less than 2600 | 7-9E10 |

TABLE 5

| | Replacement element | Replacement ratio | Average crystal grain diameter ($\mu$m) | Specific permittvity | Young's modulus (Pa) |
|---|---|---|---|---|---|
| Ex. E6 | Sb | Not more than 0.1 | 0.05 | Not more than 2000 | -6E10 |
| Ex. E7 | Fe | Not more than 0.1 | 0.06 | Not less than 2000 | 7-9E10 |
| Ex. E8 | Al | Not more than 0.1 | 0.09 | Not less than 1000 | 6-9E10 |
| Ex. E9 | Cr | Not more than 0.1 | 0.08 | Not less than 1000 | 7-9E10 |

TABLE 6

| | Replacement element | Replacement element | Average crystal grain diameter ($\mu$m) | Specific permittvity | Young's modulus (Pa) |
|---|---|---|---|---|---|
| Ex. E10 | Co | 0–1 | 0.05 | Not more than 2000 | -6E10 |
| Ex. E11 | Zn | 0–1 | 0.05 | Not more than 2000 | 6-9E10 |
| Ex. E12 | Mn | 0–1 | 0.03 | Not more than 2000 | 7-9E10 |
| Ex. E13 | Ni | 0–1 | 0.03 | Not more than 2000 | 7-9E10 |

TABLE 7

|  | Replacement element | Replacement ratio | Average crystal grain diameter (μm) | Specific permittvity | Young's modulus (Pa) |
|---|---|---|---|---|---|
| Ex. E14 | Ta | 0–1 | 0.05 | Not more than 2000 | 6-9E10 |
| Ex. E15 | Sb | 0–1 | 0.03 | Not more than 2000 | 6-9E10 |

What is claimed is:

1. In a piezoelectric thin film formed by lamination of a plurality of layers, the improvement wherein the piezoelectric thin film is formed by a plurality of crystallizing steps such that it comprises:
   a) a cross section that is free of any laminar interface;
   b) a thickness in the range of from 0.5 μm; and
   c) crystal grains having an average grain diameter of 0.005 to 0.2 μm.

2. A piezoelectric thin film according to claim 1 which comprises a piezoelectric material of a three-component system represented by the formula $xPb(Mg_{1/3}Nb_{2/3})O_3$-$yPbZrO_3$-$zPbTiO_3$, wherein x, y, and z represent molar ratios provided that x+y+z=1, and x, y, and z indicate a point falling within the area defined by lines connecting the following four points A, B, C, and D in a composition diagram of the three-component system represented by said formula:

A (x=0.05, y=0.40, z=0.55),

B (x=0.05, y=0.60, z=0.35),

C (x=0.25, y=0.30, z=0.45), and

D (x=0.25, y=0.50, z=0.25).

3. A piezoelectric thin film according to claim 1 which comprises a piezoelectric material of a three-component system represented by the formula $Pb(1-\alpha)\Gamma\alpha[(Mg_{1/3}Nb_{2/3})xZryTiz]O_3$, wherein x, y, and z represent molar ratios provided that x+y+z=1, and x, y, and z indicate a point falling within the area defined by lines connecting the following four points A, B, C, and D in a composition diagram of the three-component system represented by said formula:

A (x=0.05, y=0.40, z=0.55),

B (x=0.05, y=0.60, z=0.35),

C (x=0.25, y=0.30, z=0.45), and

D (x=0.25, y=0.50, z=0.25);

Γ represents an element selected from Sr, Ca, Ba, Bi, and La; and α is $0<\alpha\leq 0.2$.

4. A piezoelectric thin film according to claim 1, wherein the thickness is in the range of from 0.5 to 20 μm, the thin film being free from any multilayer structure in the cross section.

5. A piezoelectric thin film according to any one of claim 2 further comprising another Pb or Pb compound thereby the mole ratio of Pb to (Mg+Nb+Zr+Ti) is 1 to 1.2.

6. A piezoelectric thin-film device comprising a piezoelectric thin film according to any one of claim 4 sandwiched between two electrode layers.

7. An ink jet recording head comprising, as a vibrator, a piezoelectric thin film according to any one of claim 4.

8. An ink jet recording head comprising, as a vibrator, a piezoelectric thin film according to claim 5.

9. A piezoelectric thin film as claimed in claim 4, wherein the cross section is free of cracks.

10. The piezoelectric thin film of claim 1 produced by a process comprising the steps of:
   a) coating a substrate with a sol composition comprising a sol of a metal component for constituting a piezoelectric film, and a polymer compound and then drying the coating to form a film;
   b) pre-sintering the film to form a porous thin film of gel comprising an amorphous metal oxide;
   c) pre-annealing the porous thin film of gel to bring the film to a film formed of a crystalline metal oxide;
   d) laminating the film formed in step c) by repeating the steps a), b), and c) at least once to form a laminated film formed of a crystalline metal oxide; and
   e) annealing the film prepared in step d) to grow perovskite crystal grains in the film into a larger size; said steps a), b), c), d) and e) producing the piezoelectric thin film with a cross section that is free of any interface created by the laminating step d); a thickness in the range of from 0.5 μm to 20 μm; and crystal grains having an average grain diameter of 0.005 to 0.2 μm.

11. The piezoelectric thin film according to claim 10, wherein the pre-annealing in the step c) is carried out at a temperature in the range of from 400 to 800° C.

12. The piezoelectric thin film according to claim 10, wherein the annealing in the step e) is carried out at a temperature in the range of from 600 to 1200° C.

13. The piezoelectric thin film according to claim 10, wherein the annealing in the step e) is carried out at a temperature in the range of from 800 to 1000° C.

14. The piezoelectric thin film according to claim 10, wherein the pre-annealing in the step c) is carried out in two stages, the first stage of which is carried out at a temperature in the range of from 400 to 600° C. with the second stage being carried out at a temperature in the range of from 600 to 800° C.

15. The piezoelectric thin film according to claim 10, wherein the annealing in the step e) is carried out in two stages, the first stage of which is carried out at a temperature in the range of from 600 to 800 ° C. with the second stage being carried out at a temperature in the range of from 800° C. to 1000° C.

16. The piezoelectric thin film according to claim 10, wherein the thickness of the porous thin film formed in the step b) is 0.01 to 1 μm.

17. The piezoelectric thin film according to claim 10, wherein the laminated film formed of a crystalline metal oxide prepared in the step d) is patterned into a piezoelectric thin-film device form prior to the step e).

18. The piezoelectric thin film according to claim 10, wherein the polymer compound added to the sol composition is polyethylene glycol.

19. The piezoelectric thin film according to claim 10, wherein the polymer compound added to the sol composition is polypropylene glycol.

20. The piezoelectric thin film of claim 8 produced by a process comprising the steps of:
   a) coating a substrate with a sol composition comprising a sol of a metal component for constituting a piezoelectric film, and a polymer compound and then drying the coating to form a film;

b) pre-sintering the film to form a porous thin film of gel comprising an amorphous metal oxide;

c) laminating the film formed in step b) by repeating the steps a) and b) at least once to form a laminate comprising an amorphous metal oxide;

d) pre-annealing the laminate to convert the laminate to a film formed of a crystalline metal oxide;

e) repeating the steps c) and d) at least once to form a laminated film formed of a crystalline metal oxide; and f) annealing the film prepared in the step e) to grow crystal grains of perovskite type in the film into a larger size, said steps a), b), c), d), e) and f) producing the piezoelectric thin film with a cross section that is free of any interface created by the laminating step c); a thickness in the range of from 0.5 $\mu$m to 20 $\mu$m; and crystal grains having an average grain diameter of 0.005 to 0.2 $\mu$m.

21. The piezoelectric thin film according to claim 20, wherein the pre-annealing in the step d) is carried out at a temperature in the range of from 400 to 800° C.

22. The piezoelectric thin film according to claim 20, wherein the annealing in the step f) is carried out at a temperature in the range of from 600 to 1200° C.

23. The piezoelectric thin film according to claim 20, wherein the annealing in the step f) is carried out at a temperature in the range of from 800 to 1000° C.

24. The piezoelectric thin film according to claim 20, wherein the pre-annealing in the step d) is carried out in two stages, the first stage of which is carried out at a temperature in the range of from 400 to 600° C. with the second stage being carried out at a temperature in the range of from 600 to 800° C.

25. The piezoelectric thin film according to claim 20, wherein the annealing in the step f) is carried out in two stages, the first stage of which is carried out at a temperature in the range of from 600 to 800 ° C. with the second stage being carried out at a temperature in the range of from 800° C. to 1000° C.

26. The piezoelectric thin film according to claim 20, wherein the thickness of the porous thin film formed in the step c) is 0.01 to 1 $\mu$m.

27. The piezoelectric thin film according to claim 20, wherein the laminated film, formed of a crystalline metal oxide, prepared in the step e) is patterned into a piezoelectric thin-film device form prior to the step f).

28. The piezoelectric thin film according to claim 20, wherein the polymer compound added to the sol composition is polyethylene glycol.

29. The piezoelectric thin film according to claim 20, wherein the polymer compound added to the sol composition is polypropylene glycol.

30. An ink jet recording head comprising, as a vibrator, a piezoelectric thin film according to claim 2.

31. An ink jet recording head comprising, as a vibrator, a piezoelectric thin film according to claim 3.

* * * * *